United States Patent
Im

(10) Patent No.: US 7,190,619 B2
(45) Date of Patent: Mar. 13, 2007

(54) CIRCUIT FOR INDICATING TERMINATION OF SCAN OF BITS TO BE PROGRAMMED IN NONVOLATILE SEMICONDUCTOR MEMORY DEVICE

(75) Inventor: Jae-Woo Im, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 11/206,586

(22) Filed: Aug. 17, 2005

(65) Prior Publication Data

US 2006/0109714 A1 May 25, 2006

(30) Foreign Application Priority Data

Nov. 22, 2004 (KR) .................. 10-2004-0095595

(51) Int. Cl.
*G11C 16/04* (2006.01)
(52) U.S. Cl. ............... 365/185.17; 365/236; 365/225.7
(58) Field of Classification Search ........... 365/185.17
See application file for complete search history.

(56) References Cited

U.S. PATENT DOCUMENTS

| 6,597,605 B2 | 7/2003 | Kreifels et al. | |
| 2003/0043628 A1* | 3/2003 | Lee ....................... | 365/185.17 |

FOREIGN PATENT DOCUMENTS

| JP | 10-334675 | 12/1998 |
| JP | 11-353886 | 12/1999 |
| KR | 2002-004772 | 6/2002 |
| KR | 2002-0087168 | 11/2002 |

OTHER PUBLICATIONS

English language abstract of the Korean Publication No. 2002-004772.
English language abstract of the Korean Publication No. 2002-0087168.
English language abstract of the Japanese Publication No. 10-334675.
English language abstract of the Japanese Publication No. 11-353886.

* cited by examiner

*Primary Examiner*—Thong Q. Le
(74) *Attorney, Agent, or Firm*—Marger Johnson & McCollom, P.C.

(57) ABSTRACT

A circuit for indicating termination of scan of bits to be programmed in a nonvolatile semiconductor memory device includes a counting unit, a set bit number provision unit and a comparison unit. The counting unit counts the predetermined number of bits to be programmed, and provides a group of counting bit signals indicating the number of bits to be programmed. The set bit number provision unit provides a group of set bit signals indicating the number of set bits. The number of set bits can be externally controlled. The comparison unit compares the group of counting bit signals with the group of set bit signals and ultimately provides a scan termination signal used to control programming for the memory array. The logic level of the scan termination signal is changed when the number of bits to be programmed attains the number of set bits. Accordingly, a designer or user of a nonvolatile semiconductor memory device can adjust the number of bits to be simultaneously programmed, and the time required for a complete program operation can be shortened.

7 Claims, 7 Drawing Sheets

CIRCUIT FOR INDICATING TERMINATION OF SCAN OF BITS TO BE PROGRAMMED IN NONVOLATILE SEMICONDUCTOR MEMORY DEVICE

CROSS-REFERENCE TO RELATED APPLICATIONS

This U.S. non-provisional patent application claims priority under 35 U.S.C. § 119 of Korean Patent Application No. 10-2004-95595, filed on Nov. 22, 2004, the entire contents of which are hereby incorporated by reference.

BACKGROUND

1. Field of the Invention

The present invention relates, in general, to nonvolatile semiconductor memory devices and, more particularly, to a circuit for indicating the termination of scan of bits to be programmed, which generates a scan termination signal indicating that a set number of bits to be programmed have been completely scanned.

2. Description of the Related Art

A nonvolatile semiconductor memory device, such as a flash memory device, has a function of electrically erasing stored data a field or string at a time and has low power consumption characteristics. Therefore, the nonvolatile semiconductor memory device has attracted attention as a recording medium for portable terminals, such as digital cameras and memory cards, in addition to permanent memory devices used for personal notebook computers, etc.

The state of data stored in the nonvolatile semiconductor memory device is determined by the threshold voltage of a transistor forming a memory cell. That is, different charges are stored in a floating gate of the memory cell, so that the threshold voltages of the transistor of the memory cell are changed to intended preset levels. Through this process, data stored in the memory cell is programmed to have states that can be identified in a read operation.

In the meantime, nonvolatile semiconductor memory devices are classified into NAND-type memory and NOR-type memory according to the form of the connection of memory cells to bit lines. In the case of a NAND-type nonvolatile semiconductor memory device, memory cells M11 to M14 form a string together with selection transistors ST1 and ST2, and are connected in series with each other between a bit line BL and a ground voltage VSS, as shown in FIG. 1. The programming of such a NAND-type nonvolatile semiconductor memory device is performed using Fowler-Nordheim (F-N) tunneling. In this case, since a Ground Selection Line (GSL) signal is in a logic L (low) state, the amount of current consumption is relatively low. Therefore, the NAND-type nonvolatile semiconductor memory device performs programming for all memory cells connected to a single word line (any of WL11 to WL14) through a single program operation.

In the meantime, in the case of a NOR-type nonvolatile semiconductor memory device, memory cells M21 to M26 are connected between a bit line BL1 or BL2 and a source line CSL, as shown in FIG. 2. Programming for such a NOR-type nonvolatile semiconductor memory device is performed using Channel Hot Electron (CHE) injection. In this case, a current path is formed between the bit line BL and the source line CSL, so that the amount of current consumption is relatively high. Accordingly, the NOR-type nonvolatile semiconductor memory device performs programming for memory cells, selected a column at a time to allow the number of memory cells to correspond to the number of set bits, through a single program operation. For this operation, in the NOR-type nonvolatile semiconductor memory device, a data scan operation of scanning a certain number of data bits to be programmed is performed. Further, the NOR-type nonvolatile semiconductor memory device includes a circuit for indicating the termination of scan of bits to be programmed therein to generate a scan termination signal. The scan termination signal indicates that a number of set data bits to be programmed have been completely scanned.

FIG. 3 is a view showing a conventional circuit 100 for indicating the termination of scan of bits to be programmed. A counter 110 counts the number of bits to be programmed, that is, the number of data bits scanned in a data scan operation and to be programmed. A group of counting bit signals CNT<n:0>, which indicates the number of bits to be programmed, is provided to a bit number attainment detection unit 120. Further, the bit number attainment detection unit 120 changes the logic level of a scan termination signal SCT when the number of bits to be programmed attains the number of set bits.

However, the conventional circuit 100 for indicating the termination of scan of bits to be programmed is problematic in that the number of set bits is fixed to a specific number set at the time of manufacturing a nonvolatile semiconductor memory device, and cannot be changed after the manufacture of the nonvolatile semiconductor memory device has been completed.

SUMMARY

Accordingly, the present invention has been made keeping in mind the above problems occurring in the prior art. An object of the present invention is to provide a circuit for indicating the termination of scan of bits to be programmed, which can change the number of set bits even after the manufacture of a nonvolatile semiconductor memory device has been completed.

An embodiment of the present invention provides a circuit for indicating the termination of scan of bits to be programmed in a nonvolatile semiconductor memory device. A nonvolatile semiconductor memory device to which the present invention can be applied includes a memory array having a plurality of memory cells arranged between word lines and bit lines in a NOR-type array, the memory cells, the number of which corresponds to the number of set bits, being simultaneously programmed through a single program operation. The circuit for indicating the termination of scan of bits to be programmed according to the present invention comprises a counting unit, a set bit number provision unit and a comparison unit. The counting unit counts the number of bits to be programmed and provides a group of counting bit signals that indicates the number of bits to be programmed. The number of bits to be programmed is the number of data bits to be programmed among scanned data bits. The set bit number provision unit provides a group of set bit signals indicating the number of set bits. The number of set bits can be externally controlled. The comparison unit compares the group of counting bit signals with the group of set bit signals to ultimately provide a scan termination signal used to control programming for the memory array. The scan termination signal has a logic level changed when the number of bits to be programmed attains the number of set bits.

Preferably, the set bit number provision unit may comprise a fuse box, a mode register and a multiplexer. The fuse box includes a plurality of fuses and provides a group of fuse bit signals indicating the number of fuse bits. The number of fuse bits can be adjusted according to whether to blow the fuses. Whether to blow the fuses can be externally controlled. The mode register provides a group of mode bit signals indicating the number of mode bits. The number of mode bits can be adjusted in response to external mode setting signals. The multiplexer provides any one group selected from the group of fuse bit signals and the group of mode bit signals as the group of set bit signals.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
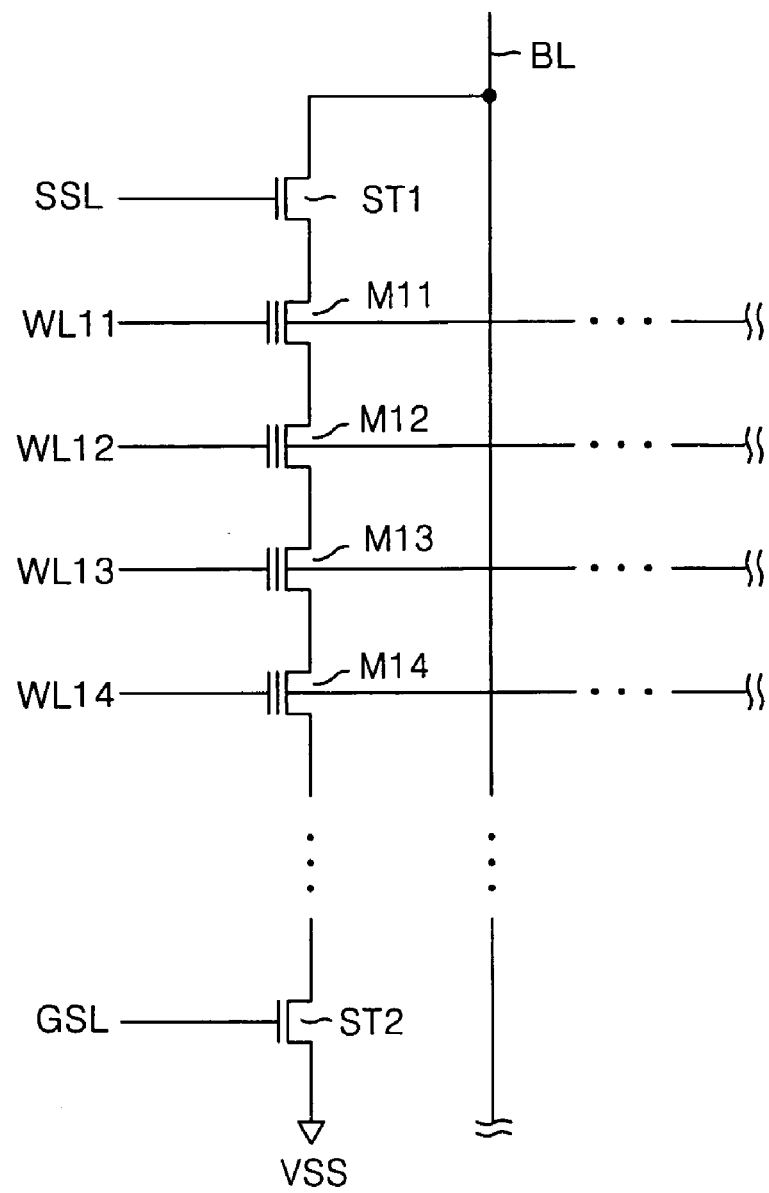
FIG. 1 is a schematic diagram of a memory array of a typical NAND-type nonvolatile semiconductor memory device.

The above and other objects, features and other advantages of the present invention will be more clearly understood from the following detailed description taken in conjunction with the accompanying drawings. Reference now should be made to the drawings, in which the same reference numerals are used throughout the different drawings to designate the same or similar components.

Hereinafter, embodiments of the present invention will be described in detail with reference to the attached drawings.

Figure 2:
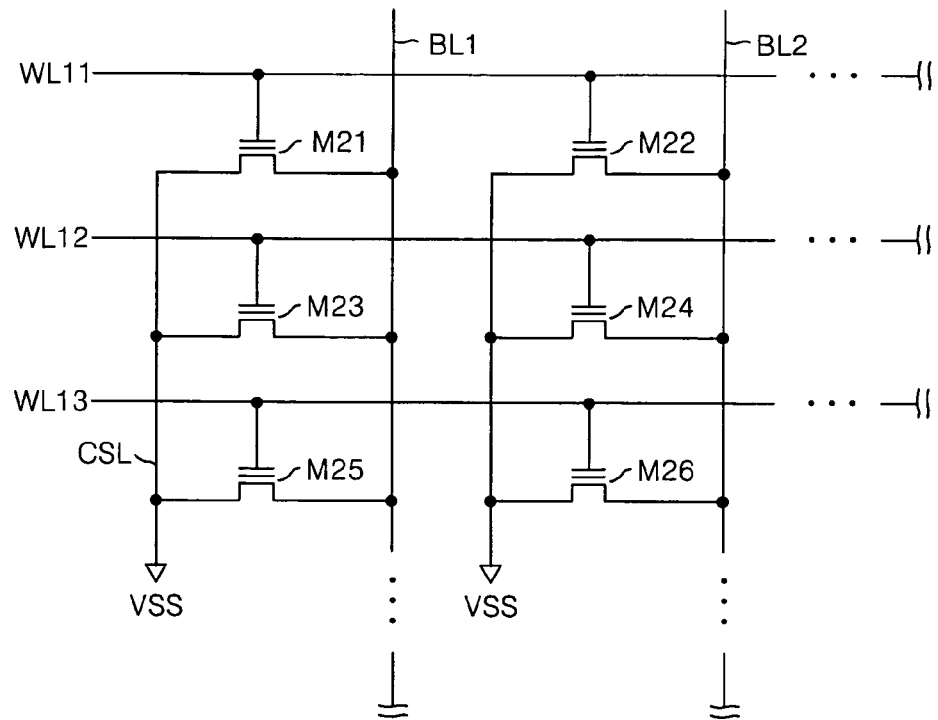
FIG. 2 is a schematic diagram of a memory array of a typical NOR-type nonvolatile semiconductor memory device.
Figure 3:
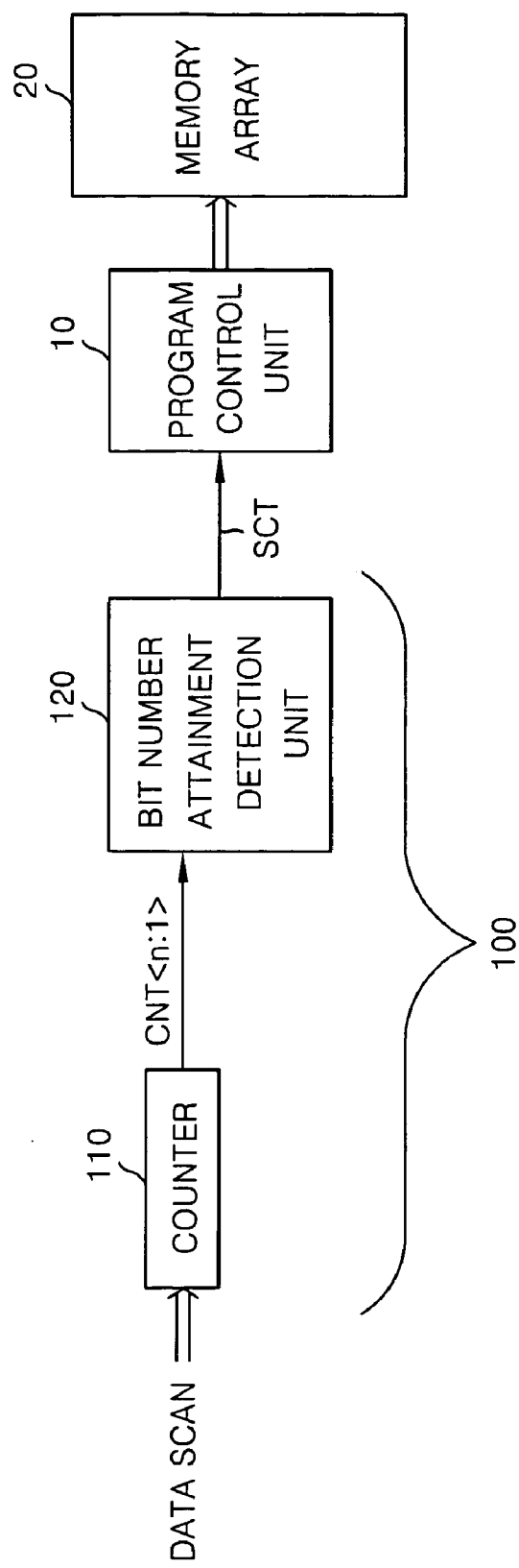
FIG. 3 is a block diagram of a conventional circuit for indicating the termination of scan of bits to be programmed.
Figure 4:
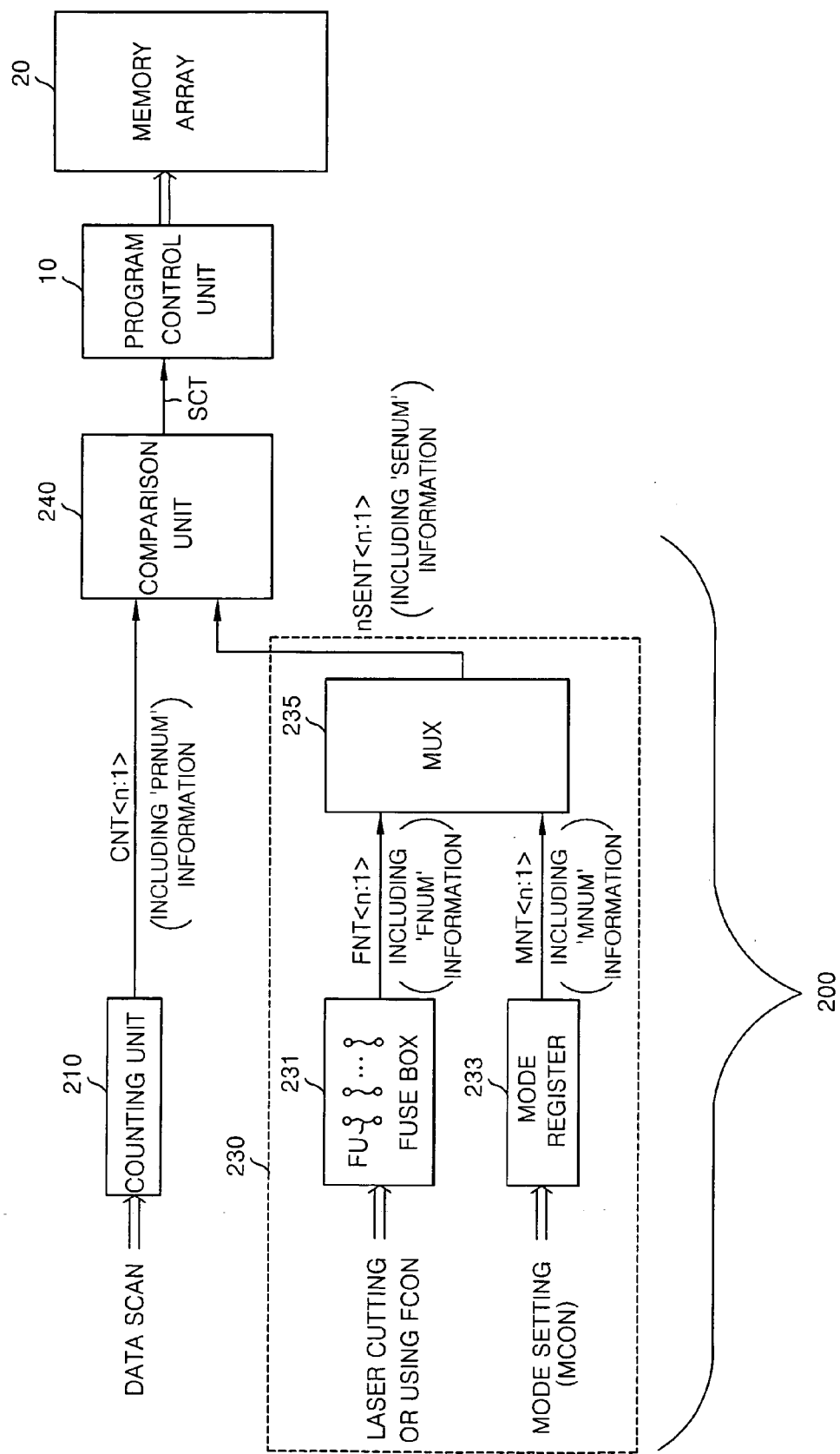
FIG. 4 is a block diagram of a circuit for indicating the termination of scan of bits to be programmed in a nonvolatile semiconductor memory device according to an embodiment of the present invention.

FIG. 4 shows a circuit 200 for indicating the termination of scan of bits to be programmed in a nonvolatile semiconductor memory device according to an embodiment of the present invention. The nonvolatile semiconductor memory device to which the present invention can be applied is a NOR-type memory device. Therefore, as described above with reference to FIG. 2, memory cells included in a memory array 20 are arranged between word lines and bit lines in a NOR-type array. Further, memory cells, the number of which corresponds to the number of set bits SENUM, are simultaneously programmed through a single program operation.

Referring to FIG. 4, the circuit 200 for indicating the termination of scan of bits to be programmed according to the present invention includes a counting unit 210, a set bit number provision unit 230 and a comparison unit 240. The counting unit 210 counts the predetermined number of bits to be programmed PRNUM. The number of bits to be programmed represents the number of data bits scanned in a data scan operation and required to be programmed (for example, "0"). The number of bits to be programmed PRNUM can be indicated by a group of counting bit signals CNT<7:0> provided from the counting unit 210 to the comparison unit 240, and this indication method is well known to those skilled in the art.

The set bit number provision unit 230 provides a group of set bit signals nSENT<n:1> to the comparison unit 240. The group of set bit signals nSENT<n:1> includes information about the number of set bits SENUM.

According to a preferred embodiment, the set bit number provision unit 230 includes a fuse box 231, a mode register 233 and a multiplexer (MUX) 235. The fuse box 231 includes a plurality of fuses FUs, and provides a group of fuse bit signals FNT<n:1> to the multiplexer MUX 235. Further, information about the number of fuse bits FNUM is included in the group of fuse bit signals FNT<n:1>, and the number of fuse bits FNUM is adjusted according to whether to blow the fuses FUs.

Whether to blow the fuses FUs can be externally controlled. For example, the fuses FUs can be electrically blown using external laser beams or fuse control signals FCON. Further, the fuses FU can be implemented using flash cells (not shown) that are programmable and erasable in response to external fuse control signals. In this case, each of the flash cells is controlled so that two terminals thereof connected to each other are electrically disconnected according to programming or erasure results.

The mode register 233 provides a group of mode bit signals MNT<n:1> to the MUX 235. The number of mode bits MNUM included in the group of mode bit signals MNT<n:1>can be adjusted in response to external mode setting signals MCON.

The multiplexer MUX 235 selects any one of the group of fuse bit signals FNT<n:1>, provided from the fuse box 231, and the group of mode bit signals MNT<n:1>, provided from the mode register 233, and provides the selected group as the group of set bit signals nSENT<n:1>. The selection of the group of set bit signals nSENT<n:1> performed by the multiplexer MUX 235 can be implemented using a variety of methods, such as a control method using a MUX control signal (not shown) or a method of selecting a signal group having a higher value. Further, such a selection method is apparent to those skilled in the art, so that detailed descriptions thereof are omitted.

Consequently, the number of set bits SENUM provided from the set bit number provision unit 230 can be externally controlled after the manufacture of the nonvolatile semiconductor memory device has been completed.

The comparison unit 240 compares the group of counting bit signals CNT<n:1> with the group of set bit signals nSENT<n:1> and provides a scan terminal signal SCT. The level of the scan termination signal SCT is changed when the number of bits to be programmed PRUM attains the number of set bits SENUM. Further, the scan termination signal SCT is provided to the program control unit 10 and ultimately controls programming for the memory cells in the memory array 20.

Figure 5:
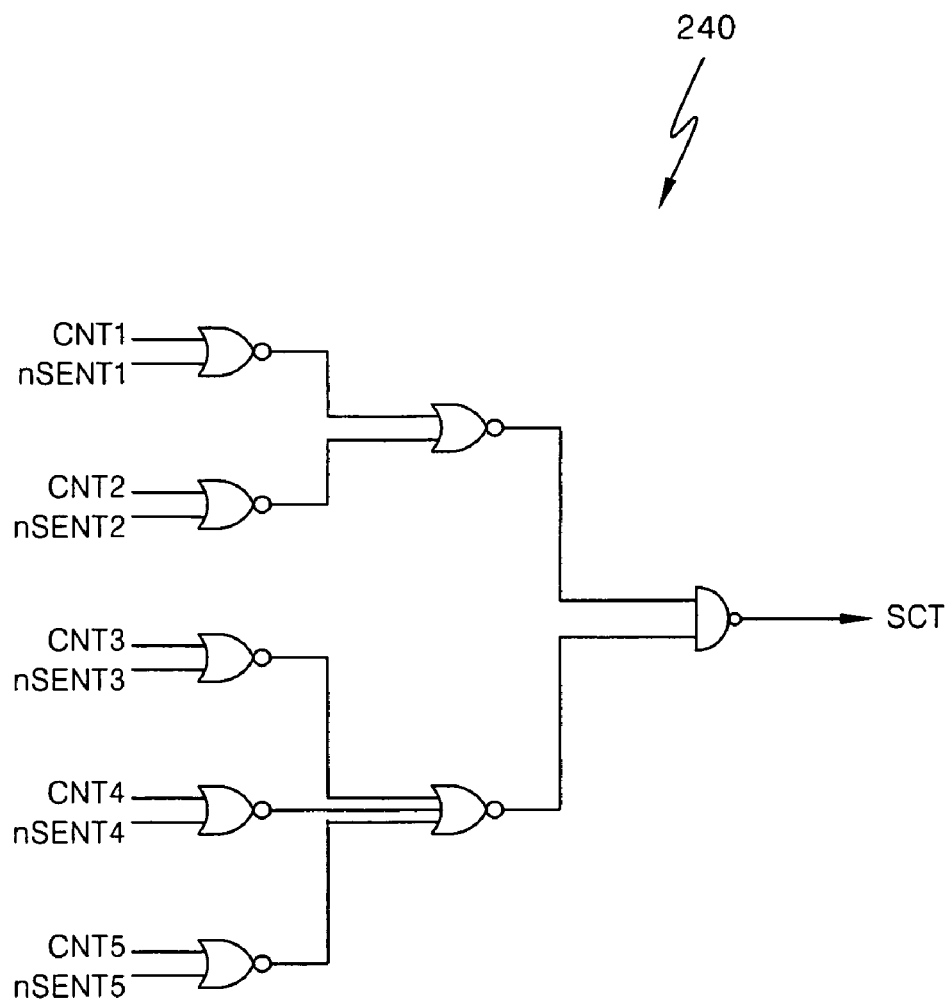
FIG. 5 is a logic diagram of a detailed example of a comparison unit of FIG. 4.

FIG. 5 shows a detailed example of the comparison unit 240 of FIG. 4. In FIG. 5, a case where n is 5 is depicted. If it is assumed that the number of set bits SENUM is 8, 16 will be expressed as "01000" in binary form. In this case, signals in the group of set bit signals nSENT<n:1> are obtained by inverting "01000", which is data expressing 16 in binary form, and are shown in Table 1.

TABLE 1

| Signal | nSENT1 | nSENT2 | nSENT3 | nSENT4 | nSENT5 |
|--------|--------|--------|--------|--------|--------|
| Data | 1 | 0 | 1 | 1 | 1 |

In this case, signals nSENT1 to nSENT5 indicate data values in descending order of significance, and this indication method can be variously changed.

If respective signals in the group of counting bit signals CNT<n:1> have the same logic values as those of the group of set bit signals nSENT<n:1>, the logic level of the scan termination signal SCT, which is the output signal of the comparison unit 240, is changed from a logic L state to a logic H state.

In brief, if the circuit 200 for indicating the termination of scan of bits to be programmed according to the present invention is used, the number of set bits SENUM can be externally adjusted even after the manufacture of the nonvolatile semiconductor memory device has been completed. Therefore, a designer or user of a nonvolatile semiconductor memory device to which the present invention is applied can adjust the number of bits that can be programmed through a single program operation, and the time required for a complete program operation can be remarkably shortened.

Figure 6:
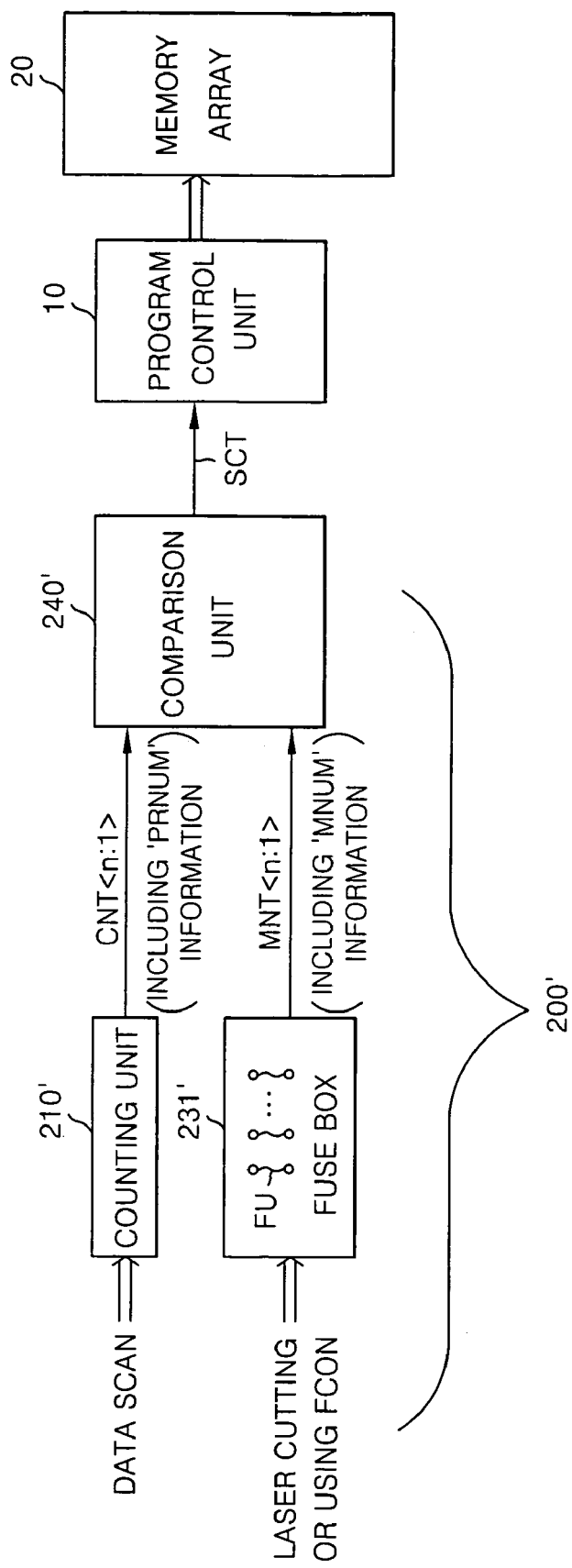
FIGS. 6 and 7 are block diagrams of a circuit for indicating the termination of scan of bits to be programmed in a nonvolatile semiconductor memory device according to different embodiments of the present invention.
Figure 7:
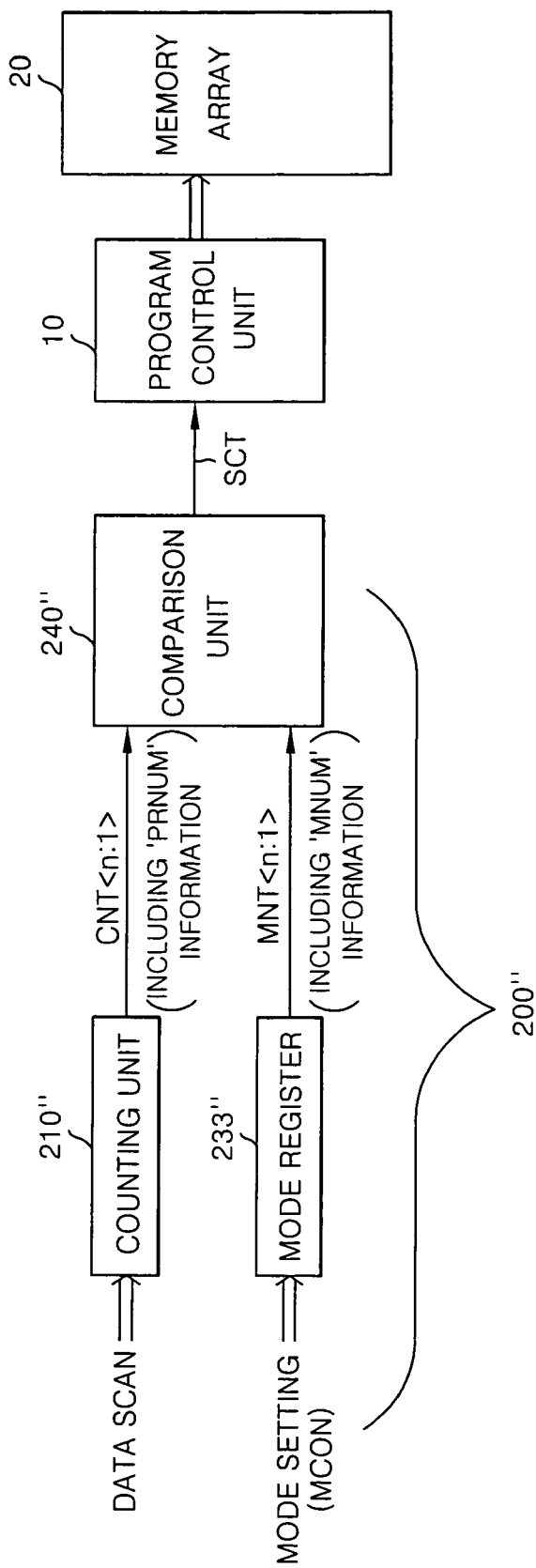

FIGS. 6 and 7 are block diagrams of circuits 200' and 200" for indicating the termination of scan of bits to be programmed in a nonvolatile semiconductor memory device according to alternative embodiments of the present invention, which are modified embodiments of the circuit 200 for indicating the termination of scan of bits to be programmed in FIG. 4. The scan termination indication circuits 200' and 200" of FIGS. 6 and 7 are almost the same as the scan termination indication circuit 200 of FIG. 4, but there is a difference in a method of setting the number of set bits SENUM. That is, the scan termination indication circuit 200 of FIG. 4 is operated in such a way that any one of the number of fuse bits FNUM, provided from the fuse box 231, and the number of mode bits MNUM, provided from the mode register 233, is provided to the comparison unit 240 through the multiplexer MUX 235 as the number of set bits SENUM. In contrast, the scan termination indication circuit 200' of FIG. 6 is operated in such a way that the number of fuse bits FNUM set in a fuse box 231' is provided to a comparison unit 240'. In other words, in the embodiment of FIG. 6, the number of fuse bits FNUM is provided as the number of set bits SENUM. Further, in the scan termination indication circuit 200" of FIG. 7, the number of mode bits MNUM set in a mode register 233" is provided to a comparison unit 240". In other words, in the embodiment of FIG. 7, the number of mode bits MNUM is provided as the number of set bits SENUM.

The other aspects of construction and operation of the scan termination indication circuits 200' and 200" according to the embodiments of FIGS. 6 and 7 are the same as those of FIG. 4, so that detailed descriptions thereof are omitted.

As described above, the present invention provides a circuit for indicating the termination of scan of bits to be programmed, which is provided with a set bit number provision unit for setting the number of set bits indicating the number of bits to be programmed through a single program operation. Further, the number of set bits can be externally controlled. Therefore, the circuit for indicating the termination of scan of bits to be programmed according to the present invention is advantageous in that a designer or user of a nonvolatile semiconductor memory device can adjust the number of bits to be programmed through a single program operation, and the time required for a complete program operation can be remarkably shortened.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A circuit for indicating termination of scan of bits to be programmed in a nonvolatile semiconductor memory device, the nonvolatile semiconductor memory device including a memory array having a plurality of memory cells arranged between word lines and bit lines in a NOR-type array, the memory cells, the number of which corresponds to the number of set bits, being simultaneously programmed through a single program operation, comprising:

a counting unit for counting the number of bits to be programmed and providing a group of counting bit signals that indicates the number of bits to be programmed, the number of bits to be programmed being the number of data bits to be programmed among scanned data bits;

a set bit number provision unit for providing a group of set bit signals indicating the number of set bits, the number of set bits being able to be externally controlled; and a comparison unit for comparing the group of counting bit signals with the group of set bit signals to ultimately provide a scan termination signal used to control programming for the memory array, the scan termination signal having a logic level changed when the number of bits to be programmed attains the number of set bits.

2. The scan termination indication circuit according to claim 1, wherein the set bit number provision unit comprises:

a fuse box including a plurality of fuses and providing a group of fuse bit signals indicating the predetermined number of fuse bits, the number of fuse bits being adjusted according to whether to blow the fuses, whether to blow the fuses being able to be externally controlled;

a mode register for providing a group of mode bit signals indicating the predetermined number of mode bits, the number of mode bits being able to be adjusted in response to external mode setting signals; and a multiplexer for providing any one group selected from the group of fuse bit signals and the group of mode bit signals as the group of set bit signals.

3. A circuit for indicating termination of scan of bits to be programmed in a nonvolatile semiconductor memory device, the nonvolatile semiconductor memory device including a memory array having a plurality of memory cells arranged between word lines and bit lines in a NOR-type array, the memory cells, the number of which corresponds to the number of set bits, being simultaneously programmed through a single program operation, comprising:

a counting unit for counting the number of bits to be programmed and providing a group of counting bit signals that indicates the number of bits to be programmed, the number of bits to be programmed being the number of data bits to be programmed among scanned data bits;

a fuse box including a plurality of fuses and providing a group of fuse bit signals indicating the predetermined number of fuse bits, the number of fuse bits being adjusted according to whether to blow the fuses, whether to blow the fuses being able to be externally controlled, the number of fuse bits being provided as the number of set bits; and a comparison unit for comparing the group of counting bit signals with the group of fuse bit signals to ultimately provide a scan termination signal used to control programming for the memory array, the scan termination signal having a logic level changed when the number of bits to be programmed attains the number of set bits.

4. The scan termination indication circuit according to claim 3, wherein the fuses can be blown by external laser beams.

5. The scan termination indication circuit according to claim 3, wherein the fuses are flash cells that are programmable and erasable in response to external fuse control signals, each of the flash cells being controlled so that two terminals thereof connected to each other are electrically disconnected according to programming or erasure results.

6. A circuit for indicating termination of scan of bits to be programmed in a nonvolatile semiconductor memory device, the nonvolatile semiconductor memory device including a memory array having a plurality of memory cells arranged between word lines and bit lines in a NOR-type array, the memory cells, the number of which corresponds to the number of set bits, being simultaneously programmed through a single program operation, comprising:

a counting unit for counting the number of bits to be programmed and providing a group of counting bit signals that indicates the number of bits to be programmed, the number of bits to be programmed being the number of data bits to be programmed among scanned data bits;

a mode register for providing a group of mode bit signals indicating the predetermined number of mode bits, the number of mode bits being adjusted in response to external mode setting signals and being provided as the number of set bits; and a comparison unit for comparing the group of counting bit signals with the group of mode bit signals to ultimately provide a scan termination signal used to control programming for the memory array, the scan termination signal having a logic level changed when the number of bits to be programmed attains the number of set bits.

7. A method for indicating termination of scan of bits to be programmed in a nonvolatile semiconductor memory device, the nonvolatile semiconductor memory device including a memory array having a plurality of memory cells arranged between word lines and bit lines in a NOR-type array, the memory cells, the number of which corresponds to the number of set bits, being simultaneously programmed through a single program operation, the method comprising:

counting the number of bits to be programmed and providing a group of counting bit signals that indicates the number of bits to be programmed, the number of bits to be programmed being the number of data bits to be programmed among scanned data bits;

providing a group of set bit signals indicating the number of set bits;

externally programming the number of set bits; and comparing the group of counting bit signals with the group of set bit signals to ultimately provide a scan termination signal used to control programming for the memory array, the scan termination signal having a logic level changed when the number of bits to be programmed attains the externally programmed number of set bits.

* * * * *